US006636997B1

United States Patent
Wong et al.

(10) Patent No.: US 6,636,997 B1
(45) Date of Patent: Oct. 21, 2003

(54) SYSTEM AND METHOD FOR IMPROVING LBIST TEST COVERAGE

(75) Inventors: Paul Wong, San Jose, CA (US); Mark O. Porter, Los Gatos, CA (US); Dwight K. Elvey, Santa Cruz, CA (US)

(73) Assignee: Fujitsu Limited, Kawasaki (JP)

( * ) Notice: Subject to any disclaimer, the term of this patent is extended or adjusted under 35 U.S.C. 154(b) by 471 days.

(21) Appl. No.: 09/695,749

(22) Filed: Oct. 24, 2000

(51) Int. Cl.$^7$ ............................................... G01R 31/28
(52) U.S. Cl. ...................................... 714/728; 714/729
(58) Field of Search .................................. 714/728, 729

(56) References Cited

U.S. PATENT DOCUMENTS

| | | | |
|---|---|---|---|
| 5,625,303 A | | 4/1997 | Jamshidi |
| 5,955,912 A | | 9/1999 | Ko |
| 5,991,909 A | * | 11/1999 | Rajski et al. ............... 714/729 |
| 6,199,184 B1 | | 3/2001 | Sim |
| 6,327,687 B1 | * | 12/2001 | Rajski et al. ............... 714/738 |
| 6,380,724 B1 | | 4/2002 | Mahurin et al. |
| 6,452,423 B1 | | 9/2002 | Das et al. |

OTHER PUBLICATIONS

Nachman, L.; Saluja, K.K.; Upadyaya, S.; Reuse, R.; Random pattern testing for sequential circuits revisited; Proceedings of Annual Symposium on Fault Tolerant Computing, Jun. 25–27, 1996.*

Lin, C.–J.; Zorian, Y.; Bhawmik, S.; PSBIST: A partial–scan based built–in self–test scheme; Proceedings International Test Conference; Oct. 17–21, 1993; Page(s): 507–516.*

U.S. patent application Ser. No. 09/570,158, Wong, filed May 11, 2000.

U.S. patent application Ser. No. 09/784,863, Wong, filed Feb. 15, 2001.

U.S. patent application Ser. No. 09/570,158, Wong, filed May 11, 2000.

\* cited by examiner

Primary Examiner—Albert Decady
Assistant Examiner—Joseph D. Torres
(74) Attorney, Agent, or Firm—Fenwick & West LLP

(57) ABSTRACT

The initialization process and structure of the system ensure that during loading of random data a 1-hot condition is maintained to the 1-hot multiplexer so as to prevent contention or a high current state. The present invention further improves observability of intermediate stages by preventing random data feeding of the state elements in scan chains that cannot tolerate random data. A scan chain having only scan registers that can receive random data is referred to as a LBIST Random Scan Chain (LRSC) and a scan chain having one or more scan registers that cannot tolerate and cannot receive random data is referred to as a "LBIST Non-random Scan Chain" (LNSC). A PRPG generates random data having a plurality of bit values to the LRSCs which is then passed to a multiple input shift register (MISR). The LNSCs do not receive random data from the PRPG but instead receive bit values from another scan chain. Before feeding bit values into a LNSC, the bit values are feed into a decoder and the LNSCs feed bit values reflecting test responses into the MISR. The system may further include recirculation lines in electrical communication with a LNSC to recirculate original bit values back into the LNSC.

25 Claims, 4 Drawing Sheets

SYSTEM AND METHOD FOR IMPROVING LBIST TEST COVERAGE

BACKGROUND OF THE INVENTION

1. Field of the Invention

The present invention relates generally to built-in self-testing of logic (LBIST), and more particularly, to an apparatus and a method for improving observability and maintaining the validity of test coverage for a scan design in an integrated circuit environment.

2. Relevant Technology

Many Integrated Circuit (IC) logic circuit designs commonly include decoder outputs in electrical communication with state elements, such as latches or flip-flops. The state elements of the IC may in turn be in electrical communication with the select lines of a passgate multiplexer. Logic Circuit designs may employ a full scan design that advantageously provides controllability and observability of the internal logic in a circuit. For circuit designs that employ scanning, the state elements are usually scannable.

Built-in self testing of logic (LBIST) is a signature-based test methodology which depends on deterministic results. At any given time during the test, the test responses must be known and are compressed into a special structure such as a multiple input shift register (MISR) to produce a unique signature. A problem with LBIST is that a full scan may be unsafe for non-random state elements. During a full scan, scannable state elements receive random data from a pseudo random pattern generator (PRPG). However, in some circuit designs, certain state elements (non-random state elements) cannot tolerate random data and will not provide valid values.

One solution to scanning circuits having one or more non-random state elements is to operate a partial scan for the circuit. In a partial scan, the PRPG provides random data to the state elements except for the non-random state elements. This avoids the above noted problems, but converting a portion of the circuit into a non-scan mode during a LBIST may prove detrimental. This is because some intermediate stages having non-random state elements lack controllability and observability, which results in poor test coverage.

A further concern during a LBIST is the validity of the bit values supplied to passgate or transmission gate multiplexers. During general circuit operation, a circuit design with a multiplexer operates according to rules that ensure that the select lines of the multiplexer are always orthogonal, i.e., only one of the select lines is on. However, under test conditions, e.g., during a LBIST, the select lines may be driven by scannable state elements that receive random data that no longer abides by the orthogonal rule.

Another concern during LBIST arises from the fact that scannable state elements in the functional paths may receive random data that results in invalid outputs. For high performance in circuit design, the complex operation of decoding a wide bus during normal circuit operation may be carried over a number of clock cycles. When a full scan design is employed, partially decoded bit values are stored in the scannable state elements. Under system operation, this configuration works satisfactorily since the above scenario can be described as a functional path. However, under test conditions such as a LBIST, the scannable state elements in the functional path receive random data which no longer abide rules. As a result, invalid input values may be introduced to logic devices and in particular, the last stage of the functional path may no longer produce the desired result such as an orthogonal result (1-hot or 1-cold). If the logic devices receiving output from the last stage of the pipeline are combinational, then this poses no problem. However, if the last stage of the pipeline outputs to a 1-hot multiplexer that requires one and only one select line to be on, then the 1-hot multiplexer output will be invalid, which may destroy the validity of the LBIST. For example, if no select lines are on (0-hot), the multiplexer output will be floating which results in a high current state that could be detrimental to integrated circuit reliability. Having multiple select lines on could cause contention that has a similar effect to the 0-hot case.

It would therefore be an advancement in the art to ensure a 1-hot condition during LBIST for a multi-cycle decoded 1-hot multiplexor. Ensuring a 1-hot condition would avoid problems associated with an unknown value and provide validity of the LBIST. It would be another advancement in the art to improve the observability of intermediate stages in a partial scan environment. It would further be an advancement in the art to achieve the foregoing while maintaining the validity of the LBIST where scannable state elements that cannot tolerate random values are involved.

SUMMARY OF THE INVENTION

The present invention is generally directed to providing a pseudo partial scan design that operates as a full scan design and behaves like a partial scan design under particular test environments. A preferred embodiment of the present invention is embodied as a system that receives valid test responses from scan chains during a self-testing of Logic (LBIST). As referenced herein, a scan chain having only scan registers that can receive random data is referred to as a LBIST Random Scan Chain (LRSC) and a scan chain having one or more scan registers that cannot tolerate and cannot receive random data is referred to as a "LBIST Non-random Scan Chain" (LNSC).

A preferred embodiment of the system includes a psuedo-random pattern generator (PRPG) to generate random data signals having a plurality of bit values. The PRPG feeds the random data signals and bit values into one or more LRSCs having one or more scan registers. After passing the bit values through the LRSC, the LRSC feeds the bit values into the MISR. The system further includes one or more LNSCs having one or more scan registers that cannot tolerate random data. The LNSCs do not receive bit values from the PRPG but instead receive bit values from another scan chain. Before feeding bit values into a LNSC, the bit values are feed into a decoder and decoded. Thereafter, the LNSCs feed bit values into the MISR. The system may further include recirculation lines in electrical communication with LNSCs to recirculate original bit values back into the LNSCs. In an embodiment, the system further includes a 1-hot multiplexer having an input line that is in electrical communication with a scan register of a scan chain. The scan register that feeds the input line of the 1-hot multiplexer may be embodied as a series of successive state elements and inverters to ensure the 1-hot condition for the input line. An output line of the 1-hot multiplexer may be in electrical communication with a scan chain, such as a LRSC.

A preferred embodiment of the system may be described as having a scan path and a functional path. The scan path includes the PRPG, a scan chain (LRSC or LNSC), and the MISR. The functional path includes one or more scan registers, one or more decoders, the 1-hot multiplexer, and output functional logic.

In a preferred embodiment the system initializes the state elements within the scan registers of the LRSCs and the LNSCs. This performs a scan flush to initialize the state elements to a zero state. Prior to running the LBIST, the system may further temporarily disable clock input to state elements in the LRSC. The system may then perform a certain number of clock cycles to input partially decoded values into the state elements of the functional path. The process may then begin the LBIST process and feed random data to the LRSCs. Bit values are also decoded and feed into the LNSCs and then recirculated back into the LNSCs. Bit values outputted from the scan chains reflect test responses and are feed into the MISR which produces a signature. Bit values are further passed along the functional path into the 1-hot multiplexer.

The initialization process and structure of the system ensures that during loading of random data a 1-hot condition is maintained to the 1-hot multiplexer so as to prevent contention or a high current state. The present invention further improves observability of intermediate stages by preventing random data feeding of the LNSCs while allowing the LNSCs to feed the MISR.

These and other features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention summarized above will be rendered by reference to the appended drawings. Understanding that these drawings only provide selected embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

A preferred embodiment of the invention is now described with reference to the Figures, where like reference numbers indicate identical or functionally similar elements. The components of the present invention, as generally described and illustrated in the Figures, may be implemented in a wide variety of configurations. Thus, the following more detailed description of the embodiments of the system and method of the present invention, as represented in the Figures, is not intended to limit the scope of the invention, as claimed, but is merely representative of presently preferred embodiments of the invention.

Figure 1:
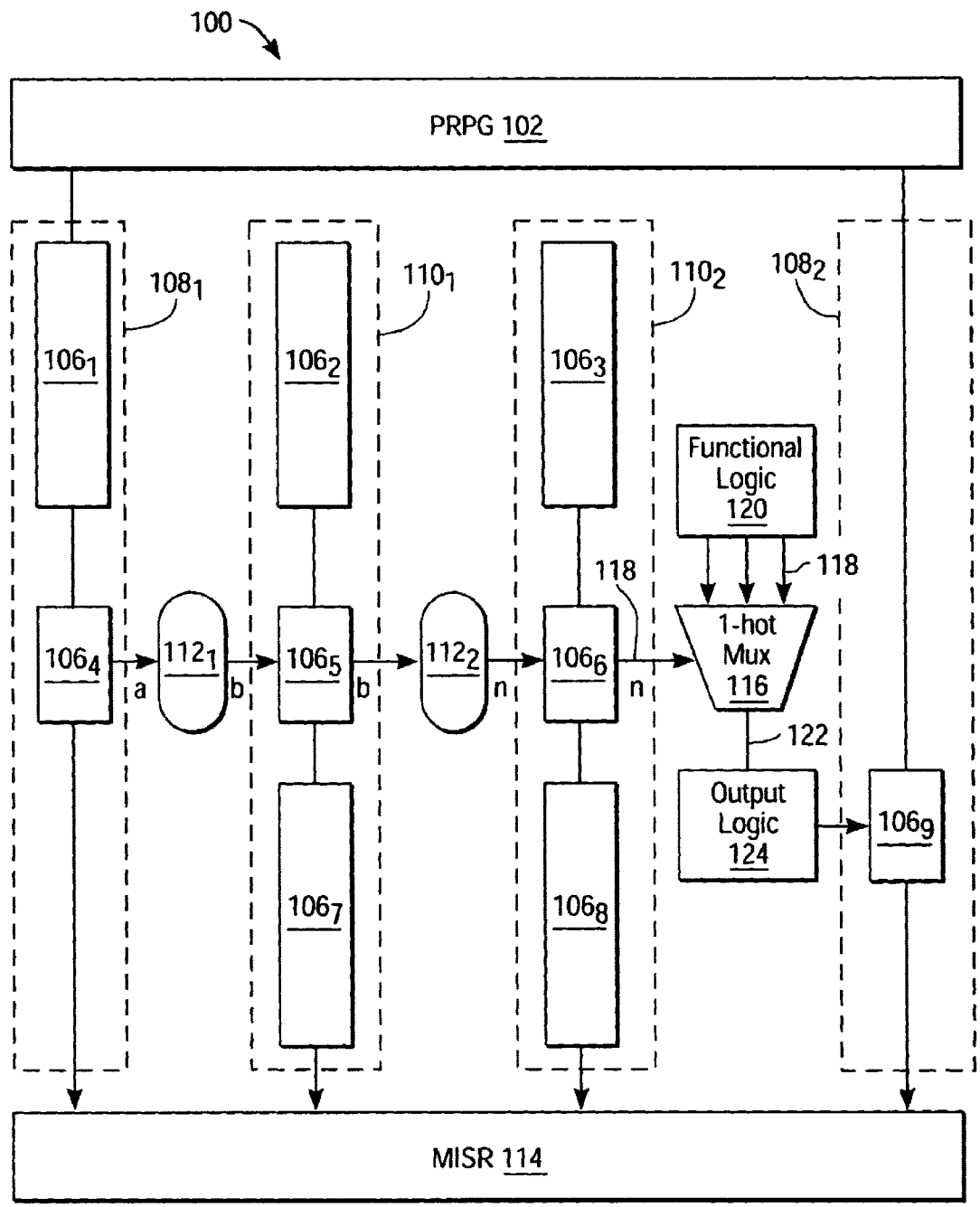
FIG. 1 is a schematic diagram of one embodiment of a system for built-in self-testing of logic (LBIST) in accordance with the present invention.

Referring to FIG. 1, a circuit diagram of a system 100 for improved test coverage during built in self-testing of logic (LBIST) is shown. For adequate test coverage during partial scan environments, the present invention provides a system for improving observability during LBIST. The system 100 includes a conventional pseudo-random pattern generator (PRPG) 102 that generates random data having a plurality of bit values. The PRPG 102 is in electrical communication with certain scan chains $108_1$, $108_2$ to thereby feed the scan chains $108_1$, $108_2$ random data. The scan chains $108_1$, $110_1$, $110_2$, $108_2$ are generally illustrated in the vertical direction.

The scan chains $108_1$, $110_1$, $110_2$, $108_2$ include one or more scan registers $106_1$, $106_4$; $106_2$, $106_5$, $106_7$; $106_3$, $106_6$, $106_8$; $106_9$ that may include one or more scannable state elements such as flip-flops or latches. The number of scan registers in each scan chain may vary depending on the design of the system 100. In a given system, certain scan registers are capable of receiving random data and others are not. As referenced herein, a scan chain $108_1$, $108_2$ having only scan registers $106_1$, $106_4$; $106_9$ that can receive random data is referred to as a LBIST Random Scan Chain (LRSC) $108_1$, $108_2$. A scan chain $110_1$, $110_2$ having one or more scan registers $106_2$, $106_5$, $106_7$; $106_3$, $106_6$, $106_8$ that cannot tolerate and cannot receive random data is referred to as a "LBIST Non-random Scan Chain" (LNSC) $110_1$, $110_2$. The PRPG $110_2$ is only in direct electrical communication with the LRSCs $108_1$, $108_2$ and does not provide random data to the LNSCs ,$110_1$, $110_2$.

The system 100 may further include one or more decoders $112_1$, $112_2$ which may be disposed in electrical communication between scan chains. As shown in FIG. 1, a decoder $112_1$, $112_2$ may be disposed between scan registers (e.g. between $106_4$ and $106_5$ and between $106_5$ and $106_6$) in separate scan chains $108_1$, $110_1$, $110_2$. The decoders $112_1$, $112_2$ may be embodied in various ways and, in one embodiment, may be an x-bit decoder such as a 2-bit decoder. The decoders $112_1$, $112_2$ receive and decode bit values which are representative of the random data feed into a LRSC $108_1$, $108_2$. A very wide decode step may require a number of clock cycles. Thus, in a single clock cycle the decoders $112_1$, $112_2$ partially decode bit values received from a scan register $106_4$, $106_5$. The system 100 further includes a conventional multiple input shift register (MISR) 114 that is in electrical communication with the LRSCs $108_1$, $108_2$ and the LNSCs $110_1$, $110_2$. During the LBIST, the LRSCs $108_1$, $108_2$ and the LNSCs $110_1$, $110_2$ feed bit values reflecting test responses directly into the MISR 114. LBIST is a signature-based test methodology that depends on deterministic results. Thus, for a successful LBIST, the test responses must be known at any given time. The test responses are compressed into the MISR 114 which is based on a predefined polynomial to produce a unique signature.

The system 100 further includes a conventional multiple input shift register (MISR) 114 that is in electrical communication with the LRSCs $108_1$, $108_2$ and the LNSCs $110_1$, $110_2$. During the LBIST, the LRSCs $108_1$, $108_2$ and the LNSCs $110_1$, $110_2$ feed bit values reflecting test responses directly into the MISR 114. LBIST is a signature-based test methodology that depends on deterministic results. Thus, for a successful LBIST, the test responses must be known at any given time. The test responses are compressed into the MISR 114 which is based on a predefined polynomial to produce a unique signature.

The system 100 may further include a 1-hot multiplexer 116 having multiple input lines 118. In one embodiment the 1-hot multiplexer 116 may be embodied as a 4-to-1 multiplexer and having an input from a scan register $106_6$ in a scan chain $110_2$. The remaining input lines to the 1-hot mutliplexer 116 may be in electrical communication with functional logic 120. The functional logic 120 may be various forms of random or combinational logic on a microchip and may include logic latches or logic flip-flops. The 1-hot multiplexer further includes an output line 122 which is in electrical communication with output logic 124. The output logic may be embodied as random or combinational logic such as latches or flip-flops. The output logic 124 may be in electrical communication with a scan register $106_9$ in a scan chain $108_2$ that feeds test responses into the MISR 114.

The system 100 in FIG. 1 may be described as having a scan path and a functional path. The scan path is illustrated in the vertical direction and includes the PRPG 102, a scan chain $108_1$, $108_2$, $110_1$, $110_2$ having one or more scan registers (e.g. $106_1$ and $106_4$; $106_2$, $106_5$, and $106_7$; $106_3$, $106_6$ and $106_8$; $106_9$) and the MISR 114. The functional path is illustrated in the horizontal direction and, in one embodiment, includes one or more scan registers (e.g. $106_4$, $106_5$, $106_6$) one or more decoders $112_1$, $112_2$, the 1-hot multiplexer 116, and the output functional logic 120.

As shown in FIG. 1, the PRPG 102 is in electrical communication with the LRSCs $108_1$, $108_2$ to deliver random data to the one more scan registers $106_1$ and $106_4$, $106_9$ within that chain. The number of LRSCs $108_1$, $108_2$ in a system 100 may vary based on design choice and is not limited to the example of FIG. 1. A LRSC $108_1$, $108_2$ may be placed in electrical communication through a decoder $112_1$ with a LNSC $110_1$, $110_2$ to pass bit values. For example, the scan register $106_4$ may be placed in electrical communication with a decoder $112_1$ as illustrated. This scan register $106_4$ may transmit a bit value represented as a. In one embodiment, a scan register $106_4$ may couple with the decoder $112_1$ through an x-bit signal line such as a 2-bit signal line. The decoder $112_1$ performs a decode of bit value a to produce a bit value b. The bit value b is then fed into a scan register $106_5$ of the LNSC $110_1$.

The LNSCs $110_1$, $110_2$ are not in direct electrical communication with the PRPG 102 and therefore do not receive random data. Because the LNSCs $110_1$, $110_2$ do not receive random data, there is no corruption by the non-random state elements and the bit value b remains valid. The observability of the intermediate non-scan stages is thereby improved. The bit value b may be feed into one or more subsequent scan registers $106_5$, $106_7$ of the LNSC $110_1$ and is further passed to the MISR 114. The LNSCs $110_1$, $110_2$ provide the MISR 114 with bit values to improve the test coverage of the intermediate bit values.

A LNSC may further be placed in electrical communication with another scan chain to pass bit values. In the example of FIG. 1, the bit value b is further feed into a second decoder $112_2$ in the functional chain. The second decoder $112_2$ performs a decode of the bit value b to produce a bit value n which is feed into a scan register $106_6$ of a subsequent LNSC $110_2$. The bit value n may thereafter feed into subsequent scan registers $106_8$ of the LNSC $110_2$ and into the MISR 114.

At some point in the functional chain, bit values are passed to the 1-hot multiplexer 116. In the example of FIG. 1, the bit value n feeds into an input line 118 of the 1-hot multiplexer 116. Because the LNSCs $110_1$, $110_2$ do not receive random data that cannot be tolerated, the bit value n received by the 1-hot mutliplexer 116 is valid.

Figure 2:
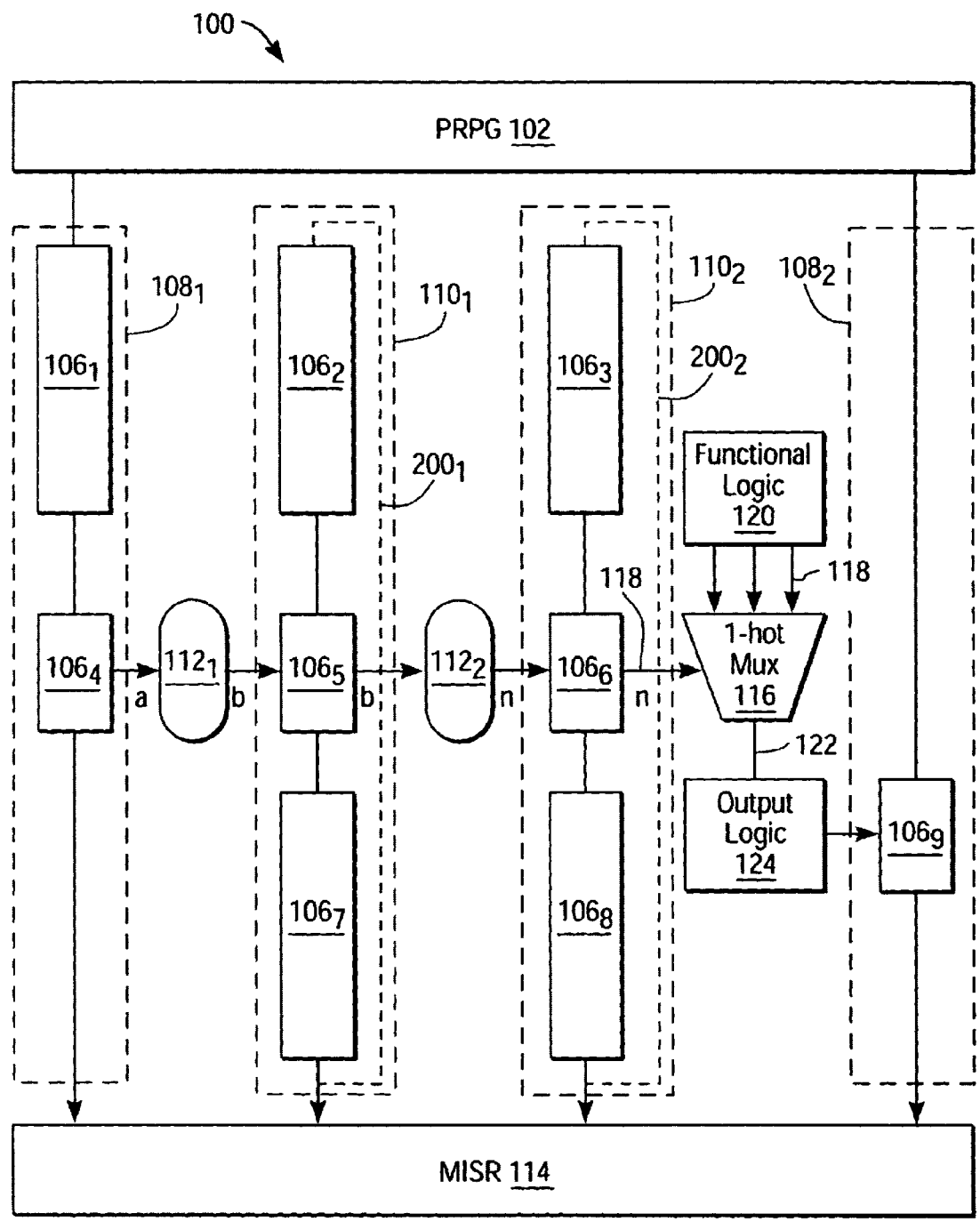
FIG. 2 is a schematic diagram of an alternative embodiment of the system of FIG. 1.

Referring to FIG. 2, an embodiment of the present invention is shown wherein the system 100 further includes recirculation lines $200_1$, $200_2$. The recirculation lines $200_1$, $200_2$ are in electrical communication with each LNSC $110_1$, $110_2$ to recirculate the original bit values back into the LNSCs $110_1$, $110_2$. In the system 100 depicted in FIG. 2, the recirculated bit values are b and n. Recirculation ensures that the LNSCs $110_1$, $110_2$ can scan values into the MISR 114 to improve observability. The original bit values in the LNSC $110_1$, $110_2$ are also maintained to restart LBIST. One of skill in the art will appreciate that there are numerous hardware embodiments for recirculating bit values in a LNSC $110_1$, $110_2$, all of which are within the scope of the present invention.

Figure 3:
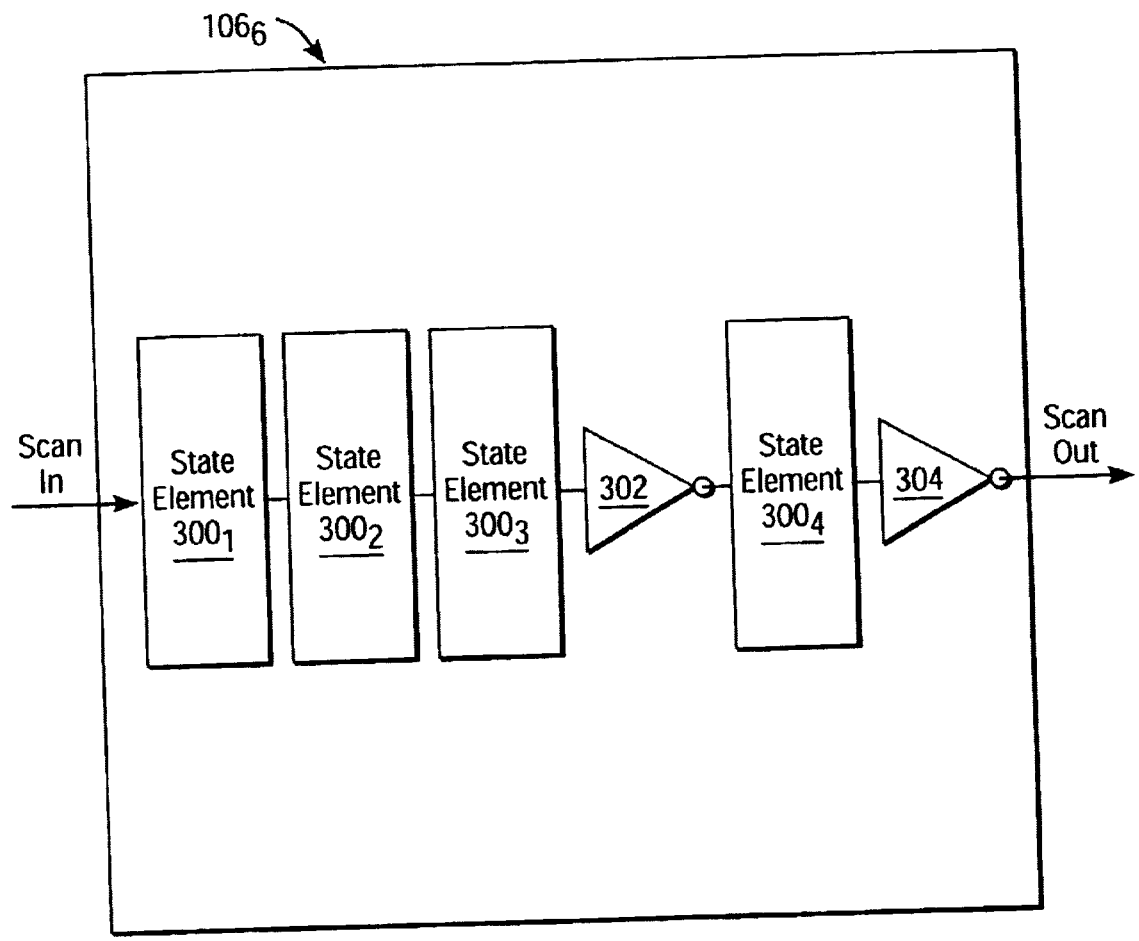
FIG. 3 is a schematic diagram of one embodiment of a scan register in a LBIST circuit in accordance with the present invention.

The embodiment shown in FIG. 2 further ensures a 1-hot condition after initial flush for an input line 118 of the multiplexer 116 in a multi-cycle decode design. To accomplish this, the scan register $106_6$ that feeds directly into the input line 118 of the 1-hot multiplexer 116 is embodied as shown in FIG. 3. The scan register $106_6$ includes a plurality of scannable state elements $300_1$, $300_2$, $300_3$, $300_4$ such as flip-flops which are disposed coupled in series along the functional path. After a certain number of state elements (e.g. $300_1$, $300_2$, $300_3$) such as three, an inverter 302 is placed in series. The inverter 302 is followed in series by another state element $300_4$ which is then followed by a second inverter 304. Bit values are inputted from the left and traverse the illustrated chain of state elements and inverters 302, 304 before feeding into the input line 118.

Figure 4:
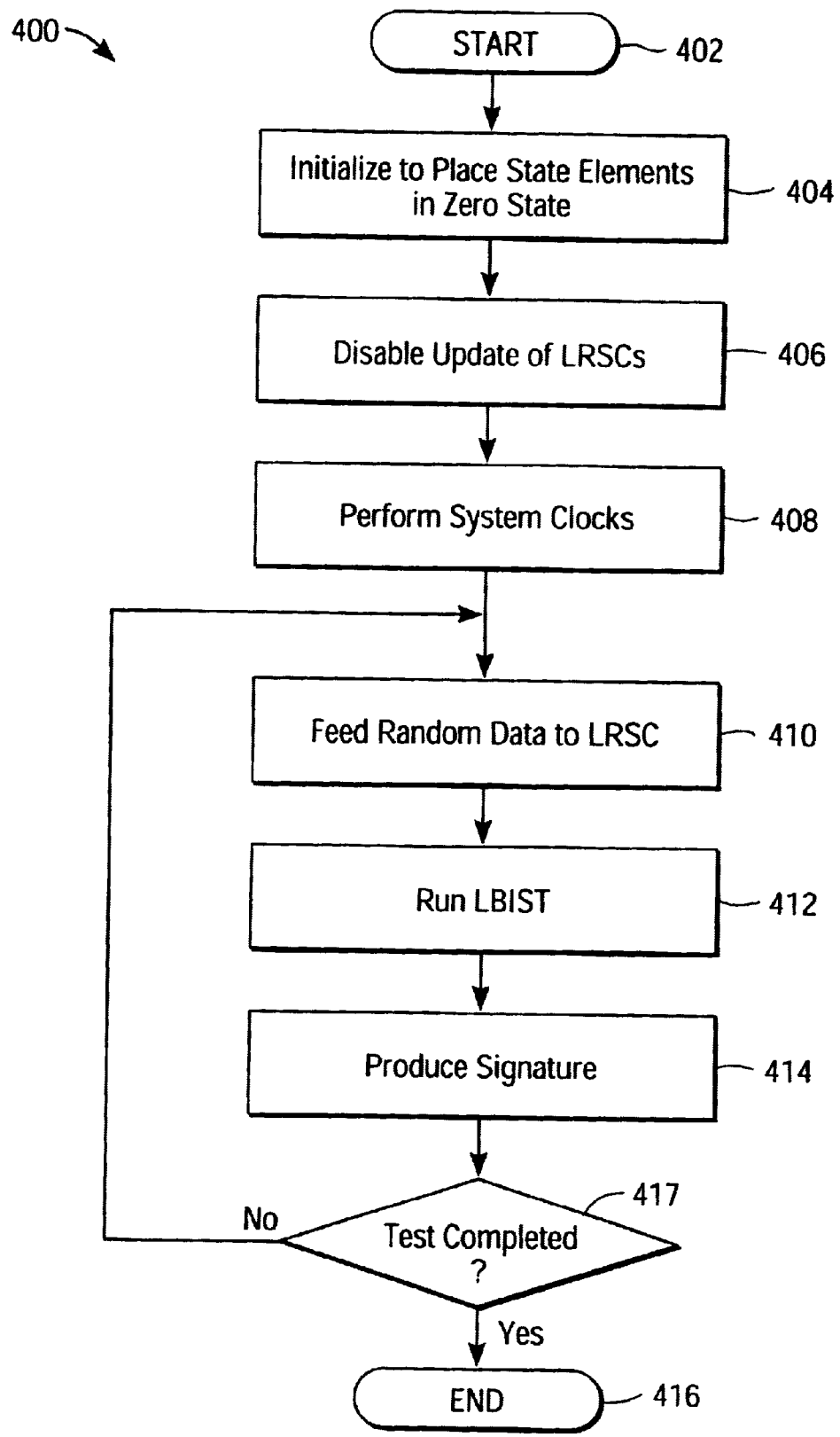
FIG. 4 is a flow diagram of a process for operation of a scan path with regard to a LBIST circuit in accordance with the present invention.

Referring to FIG. 4, a flow diagram for a preferred process 400 of operating the system 100 in accordance with the present invention is shown. After the start 402 of the process 400, the scan path initializes 404 the state elements of the scan registers by flushing the scan path. During initialization, the state elements in the LRSCs $108_1$, $108_2$ and LNSCs $110_1$, $110_2$ are flushed to a zero state. This ensures that the last scan register $106_6$ in the functional path is in a 1-hot or 1-cold condition. Upon completion of initialization, the process 400 then disables update of all the LRSCs 406 by holding the clock enable off for state elements in the LRSCs $108_1$, $108_2$.

The process then performs 408 a certain number of system clocks to establish partially decoded values in the functional path based on an all zero encoded state. The PRPG 102 feeds 410 random data to the LRSCs $108_1$, $108_2$, but not to the LNSCs $110_1$, $110_2$. The process 400 then runs 412 the LBIST sequences until complete. The MISR 114 receives bit values which indicate test responses and produces 414 a unique signature. As shown in step 417, if the test is not completed, the process returns to step 410 to repeat the process until it is completed. The signature may be examined to determine the condition of the system 100, which ends 416 process 400.

The present invention ensures that during loading of random data from a PRPG 102 a 1-hot condition exists for the 1-hot multiplexer 116 so to prevent contention or a high current state. More particulary, the present invention advantageously provides an orthogonal 1-hot select signal line 118 to the 1-hot multiplexer 116. The present invention further improves observability of intermediate stages by having the LNSCs $110_1$, $110_2$ feed the MISR 114 and not allowing the PRPG 102 to feed the LNSCs $110_1$, $110_2$.

The present invention may be embodied in other specific forms without departing from its scope or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for receiving valid data responses in a multiple shift input register (MISR) during a built-in self testing of logic (LBIST), the apparatus comprising:
   a LBIST random scan chain (LRSC) in electrical communication to receive a random data signal comprising a plurality of bit values, the LRSC further in electrical communication with the MISR to deliver valid bit values responsive to the random data signal;
   a decoder in electrical communication with the LRSC to receive the valid bit values and generate decoded bit values; and
   a LBIST non-random scan chain (LNSC) in electrical communication with the decoder to receive the decoded bit values, the LNSC further in electrical communication with the MISR to deliver valid bit values responsive to the random data signal.

2. The apparatus of claim 1, wherein the apparatus further comprises a pseudo-random pattern generator (PRPG) in electrical communication with the LRSC to generate the random data signal.

3. The apparatus of claim 1, wherein the LRSC and the LNSC comprise one or more scan registers having a plurality of successive state elements, each state element having an input and an output, an input of at least one state element in electrical communication to an output of a subsequent state element.

4. The apparatus of claim 1, further comprising a 1-hot multiplexer having a plurality of input lines, wherein one input line is in electrical communication with the LNSC to receive valid bit values from the LNSC.

5. The apparatus of claim 4, wherein the LNSC comprises one or more scan registers wherein the one input line of the 1-hot multiplexer is in electrical communication with a scan register having:
   a plurality of successive state elements in successive electrical communication with one another,
   a first inverter in electrical communication with the successive state elements,
   a final state element in electrical communication with the first inverter, and
   a second inverter in electrical communication with the final state element.

6. The apparatus of claim 4, further comprising functional logic in electrical communication with one or more input lines of the 1-hot multiplexer.

7. The apparatus of claim 4, further comprising a second LRSC in electrical communication with an output line of the 1-hot multiplexer to receive valid bit values from the 1-hot multiplexer, the second LRSC further in electrical communication with the MISR to deliver valid bit values.

8. The apparatus of claim 7, further comprising output logic in electrical communication with the output line of the 1-hot multiplexer.

9. The apparatus of claim 1, further comprising a recirculation line in electrical communication with an output line of the LNSC and an input line of the LNSC to input outputted bit values to the LNSC.

10. The apparatus of claim 1, further comprising:
    a second decoder in electrical communication with the LNSC to receive and decode bit values; and
    a second LNSC in electrical communication with the second decoder to receive decoded bit values, the LNSC further in electrical communication with the MISR to deliver valid bit values responsive to the random data signal.

11. An apparatus for receiving valid data responses in a multiple shift input register (MISR) during a built-in self testing of logic (LBIST), the apparatus comprising:
    a pseudo-random pattern generator (PRPG) in electrical communication with the LRSC to generate a random data signal comprising a plurality of bit values;
    a LBIST random scan chain (LRSC) in electrical communication with the PRPG to receive the random data signal, the LRSC further in electrical communication with the MISR to deliver valid bit values responsive to the random data signal;
    a decoder in electrical communication with the LRSC to receive the valid bit values representative of the random data signal and generate decoded bit values; and
    a LBIST non-random scan chain (LNSC) disposed in non-direct electrical communication with the PRPG and in electrical communication with the decoder to only receive decoded bit values and thereby maintain the validity of the decoded bit values.

12. The apparatus of claim 11, wherein the LNSC is further in electrical communication with the MISR to deliver valid bit values responsive to the random data signal.

13. The apparatus of claim 11, wherein the LRSC and the LNSC comprise one or more scan registers having a plurality of successive state elements, each state element having an input and an output, an input of at least one state element in electrical communication to an output of a subsequent state element.

14. The apparatus of claim 11, further comprising a 1-hot multiplexer having a plurality of input lines, wherein one input line is in electrical communication with the LNSC to receive valid bit values from the LNSC.

15. The apparatus of claim 14, wherein the LNSC comprises one or more scan registers wherein the one input line of the 1-hot multiplexer is in electrical communication with a scan register having:
    a plurality of successive state elements in successive electrical communication with one another;
    a first inverter in electrical communication with the successive state elements;
    a final state element in electrical communication with the first inverter; and,
    a second inverter in electrical communication with the final state element.

16. The apparatus of claim 14, further comprising functional logic in electrical communication with one or more input lines of the 1-hot multiplexer.

17. The apparatus of claim 14, further comprising a second LRSC in electrical communication with an output line of the 1-hot multiplexer to receive valid bit values from the 1-hot multiplexer, the second LRSC further in electrical communication with the MISR to deliver valid bit values.

18. The apparatus of claim 17, further comprising output logic in electrical communication with the output line of the 1-hot multiplexer.

19. The apparatus of claim 11, further comprising a recirculation line in electrical communication with an output line of the LNSC and an input line of the LNSC to input outputted bit values to the LNSC.

20. A method for receiving valid data responses in a multiple shift input register (MISR) during a built-in self testing of logic (LBIST), the method comprising:
    initializing a plurality of state elements in a LBIST random scan chain (LRSC) and in a LBIST non-random scan chain (LNSC);

generating a random data signal comprising a plurality of bit values;

transmitting the random data signal to the LRSC;

outputting bit values from the LRSC to the MISR in response to the random data signal;

decoding bit values outputted from the LRSC to generate decoded bit values; transmitting the decoded bit values to the LNSC; and outputting bit values from the LNSC to the MISR in response to the random data signal.

21. The method of claim 20, further comprising outputting bit values from the LNSC to an input line of a 1-hot multiplexer.

22. The method of claim 20 further comprising:

transmitting bit values from an output line of the 1-hot multiplexer to a second LRSC; and outputting bit values from the second LRSC to the MISR.

23. The method of claim 20, further comprising inputting to the LNSC bit values previously outputted from the LNSC.

24. The method of claim 20, further comprising disabling clock enablement of the LRSC.

25. The method of claim 20, further comprising running a certain number of system clocks to place bit values in a functional path defined by state elements of the LRSC and the LNSC.

* * * * *